(12) United States Patent
Choi

(10) Patent No.: US 7,968,423 B2
(45) Date of Patent: Jun. 28, 2011

(54) METHOD FOR FORMING ISOLATION LAYER AND METHOD FOR FABRICATING NONVOLATILE MEMORY DEVICE USING THE SAME

(75) Inventor: Young-Kwang Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 30 days.

(21) Appl. No.: 12/493,414

(22) Filed: Jun. 29, 2009

(65) Prior Publication Data
US 2010/0203702 A1 Aug. 12, 2010

(30) Foreign Application Priority Data
Feb. 9, 2009 (KR) .................. 10-2009-0010274

(51) Int. Cl.
*H01L 21/76* (2006.01)
(52) U.S. Cl. ........ 438/424; 438/431; 438/700; 438/795; 257/E21.546; 257/E21.547
(58) Field of Classification Search .......... 438/424, 438/431, 700, 795; 257/E21.546, E21.547
See application file for complete search history.

(56) References Cited

U.S. PATENT DOCUMENTS

| 2002/0045324 A1* | 4/2002 | Ding ............................ 438/424 |
| 2003/0186137 A1* | 10/2003 | Chan .............................. 430/5 |
| 2007/0117346 A1* | 5/2007 | Kwak .......................... 438/424 |
| 2008/0042283 A1* | 2/2008 | Purushothaman et al. ... 257/754 |

FOREIGN PATENT DOCUMENTS
KR 1020050066368 6/2005

OTHER PUBLICATIONS
Notice of Preliminary Rejection issued from Korean Intellectual Property Office on Dec. 16, 2010.

* cited by examiner

*Primary Examiner* — Hsien-ming Lee
(74) *Attorney, Agent, or Firm* — IP & T Group LLP

(57) ABSTRACT

A method for fabricating a semiconductor device includes forming a hard mask pattern over a substrate, forming a protection layer by transforming a portion of a sidewall of the hard mask pattern, forming a trench by etching the substrate using the hard mask pattern and the protection layer as an etch barrier, forming an isolation layer by filling the trench with an insulation material, removing the hard mask pattern, and performing a cleaning process. By forming the protection layer, it is possible to prevent the isolation layer from being lost during the removing of the hard mask pattern and the cleaning process and thus prevent generation of a moat.

23 Claims, 5 Drawing Sheets

METHOD FOR FORMING ISOLATION LAYER AND METHOD FOR FABRICATING NONVOLATILE MEMORY DEVICE USING THE SAME

CROSS-REFERENCE TO RELATED APPLICATIONS

The present application claims priority of Korean Patent Application No. 10-2009-0010274, filed on Feb. 9, 2009, the disclosure of which is incorporated herein by reference in its entirety.

BACKGROUND OF THE INVENTION

The present invention relates to a method for fabricating a semiconductor device, and more particularly, to a method for forming an isolation layer, which is able to prevent generation of a moat, and a method for fabricating a nonvolatile memory device using the same.

Recently, researches for a so-called charge trap device (CTD) such as a charge trap type nonvolatile memory device are actively in progress to implement a large-scaled nonvolatile memory device of sub-40 nm dimensions. The charge trap type nonvolatile memory device has a stacked structure where a tunnel insulation layer, a charge trap layer, a dielectric layer and a gate electrode are sequentially stacked over a substrate and stores data by trapping or capturing charge in a trap site within the charge trap layer, wherein the trap site has a significant depth.

Meanwhile, since the charge trap type nonvolatile memory device is constructed of the combination of a plurality of unit memory devices, it requires an isolation layer to electrically isolate the unit memory devices from each other. In general, the isolation layer is formed by a shallow trench isolation (STI) method employing a trench structure.

FIGS. 1A to 1C illustrate a method for fabricating a charge trap type nonvolatile memory device in the prior art.

Referring to FIG. 1A, a tunnel insulation layer 12, a charge trap layer 13, a buffer oxide layer 14 and a hard mask nitride pattern 15 are sequentially formed over a substrate 11.

Then, after forming a trench 16 for the device isolation by etching the buffer oxide layer 14, the charge trap layer 13, the tunnel insulation layer 12 and the substrate 11 using the hard mask nitride pattern 15 as an etch barrier, an isolation layer 17 is formed by filling the trench 16 with an insulation material. Herein, the isolation layer 17 is formed using an oxide layer having a relatively superior filling characteristic, e.g., a spin on dielectric (SOD) layer, to prevent the generation of defects such as seams within the layer.

Referring to FIG. 1B, a wet etch process is performed to remove the hard mask nitride pattern 15. The hard mask nitride pattern 15 is removed using a phosphoric acid solution.

Subsequently, a cleaning process is performed to remove residue and the buffer oxide layer 14, thereby exposing the top surface of the charge trap layer 13. The cleaning process is performed using a hydro fluoric acid solution.

Referring to FIG. 1C, after forming a dielectric layer 18 along the entire surface of a resultant structure including the isolation layer 17, a gate electrode 19 is formed on the dielectric layer 18.

However, in the prior art, as the edge of the isolation layer 17 may be damaged during the process of removing the hard mask nitride pattern 15, moat (M) is generated. This is because the SOD layer used as the isolation layer 17 may contain impurities such as carbon and a lot of minute defects such as voids formed therein and thus may be comparatively easily etched by the phosphoric acid solution. Furthermore, the moat (M) becomes more serious concern in the cleaning process since the isolation layer 17 and the buffer oxide layer 14 are formed of the same oxide layer and thus the isolation layer 17 is also etched by the hydro fluoric acid solution used in the cleaning process.

Moreover, it is preferable to form the dielectric layer 18 having uniform thickness over the resultant structure so that the unit memory devices of the nonvolatile memory device have uniform performance characteristics. However, since the moat (M) has a horn shape and the dielectric layer 18 has relatively small thickness around the moat (M), it is difficult to form the dielectric layer 18 having the uniform thickness over the resultant structure, as shown in a portion indicated by a reference numeral B in FIG. 1C.

In addition, it is preferable that the charge trap layer 13 and the gate electrode 19 are electrically separated from each other by the dielectric layer 18 to enable a normal operation of the nonvolatile memory device. However, there is a concern that a coupling ratio of the charge trap layer 13 and the gate electrode 19 is changed by an electrical short through an opening in the dielectric layer 18 in the area of the moat (M), as shown in a portion indicated by a reference numeral A in FIG. 1C.

SUMMARY OF THE INVENTION

An embodiment of the present invention is directed to providing a method for forming an isolation layer of a semiconductor device, which is able to prevent generation of a moat during a process of removing a hard mask pattern and a cleaning process when forming the isolation layer.

Another embodiment of the present invention is directed to providing a method for fabricating a nonvolatile memory device, which is able to prevent performance characteristics of the nonvolatile memory device from being deteriorated by moat.

In accordance with an aspect of the present invention, there is provided a method for fabricating a semiconductor device. The method includes forming a hard mask pattern over a substrate, forming a protection layer by transforming a portion of a sidewall of the hard mask pattern, forming a trench by etching the substrate using the hard mask pattern and the protection layer as an etch barrier, forming an isolation layer by filling the trench with an insulation material, and removing the hard mask pattern. The method may further include performing a cleaning process after the removing of the hard mask pattern.

The forming of the protection layer may include oxidizing the portion of the sidewall of the hard mask pattern. The forming of the protection layer may be performed using $O_2$ plasma. The forming of the protection layer may be performed at a temperature between approximately 10° C. and approximately 400° C.

The removing of the hard mask pattern may include performing a dry etch process.

The protection layer and the isolation layer may include an oxide layer and the hard mask pattern may include a silicon layer.

In accordance with another aspect of the present invention, there is provided a method for fabricating a nonvolatile memory device. The method includes sequentially forming a tunnel insulation layer, a charge trap layer, a first protection layer and a hard mask pattern over a substrate, forming a second protection layer by transforming a portion of a sidewall of the hard mask pattern, forming a trench by etching the first protection layer, the charge trap layer, the tunnel insulation layer and the substrate using the hard mask pattern and the second protection layer as an etch barrier, forming an isolation layer by filling the trench with an insulation material, removing the hard mask pattern, and performing a cleaning process to expose the top surface of the charge trap layer.

The method may further include forming a dielectric layer along the entire surface of a resultant structure including the isolation layer; and forming a gate electrode over the dielectric layer.

The forming of the second protection layer may include oxidizing the portion of the sidewall of the hard mask pattern. The forming of the second protection layer may be performed using $O_2$ plasma. The forming of the second protection layer may be performed at a temperature between approximately 10° C. and approximately 400° C.

The removing of the hard mask pattern may include performing a dry etch process.

The first and second protection layers and the isolation layer may include an oxide layer and the hard mask pattern may include a silicon layer.

In accordance with another aspect of the present invention, there is provided a method for fabricating a nonvolatile memory device. The method includes forming a first protection layer over a substrate, forming a first hard mask layer over the substrate, forming a second hard mask layer over the first hard mask layer, wherein the first and second hard mask layers form a hard mask pattern, forming a second protection layer by oxidizing a sidewall of the first hard mask layer, wherein the second protection layer has a thickness greater than a thickness of the first protection layer, and forming a trench by etching the substrate using the hard mask pattern and the second protection layer as an etch barrier.

DESCRIPTION OF SPECIFIC EMBODIMENTS

Figure 1A:
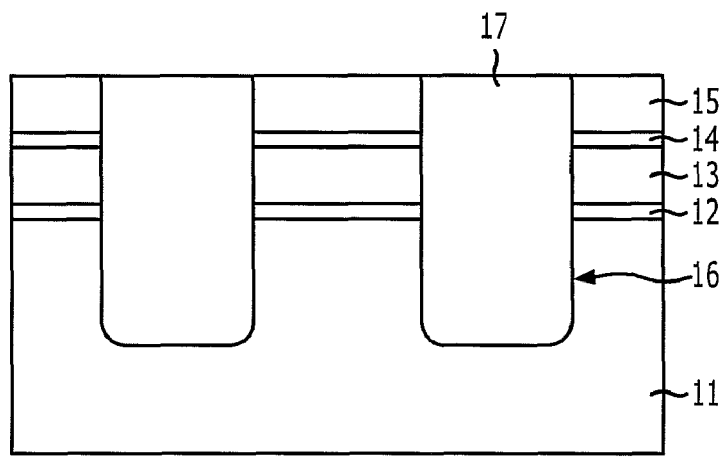
FIGS. 1A to 1C illustrate a method for fabricating a charge trap type nonvolatile memory device in the prior art.

Other objects and advantages of the present invention can be understood by the following description, and become apparent with reference to the embodiments of the present invention.

Referring to the drawings, the illustrated thickness of layers and regions are exemplary and may not be exact. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like components, although they appear in different embodiments or drawings of the present invention.

The present invention to be described hereinafter provides a method for forming an isolation layer of a semiconductor device, which is able to prevent moat from being generated during a process of removing a hard mask pattern and a cleaning process when forming the isolation layer, and a method for fabricating a nonvolatile memory device, which is able to prevent performance characteristics from being deteriorated by moat. For illustration purposes, the present invention employs a technical principle of forming a protection layer by transforming a portion of a sidewall of a hard mask pattern.

FIGS. 2A to 2F illustrate a method for fabricating a charge trap type nonvolatile memory device in accordance with an embodiment of the present invention.

Figure 2A:
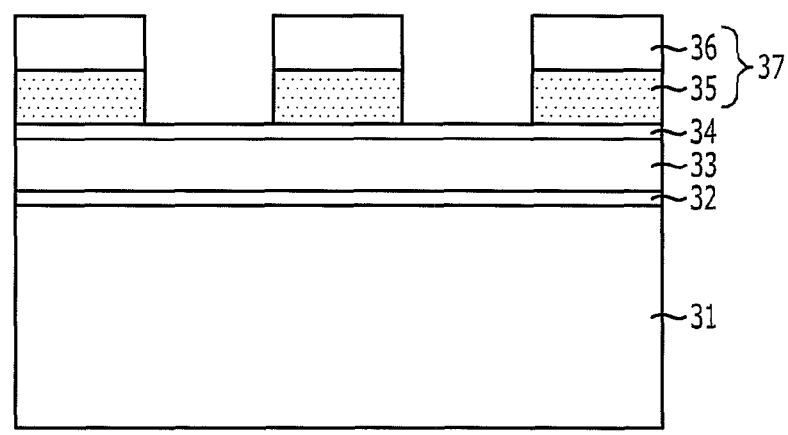
FIGS. 2A to 2F illustrate a method for fabricating a charge trap type nonvolatile memory device in accordance with an embodiment of the present invention.

Referring to FIG. 2A, a tunnel insulation layer 32 is formed over a substrate 31. The tunnel insulation layer 32 may include an oxide layer such as a silicon oxide ($SiO_2$) layer and the silicon oxide layer for the tunnel insulation layer 32 may be formed through thermal oxidation.

Then, a charge trap layer 33 is formed on the tunnel insulation layer 32. The charge trap layer 33 is a space where charge is stored, i.e., a space where data is stored. Thus, it is preferable to form the charge trap layer 33 with a material having a trap site formed therein with a significant depth. For instance, the charge trap layer 33 may be formed of a nitride layer and the nitride layer may include a silicon nitride ($Si_3N_4$) layer.

A first protection layer 34 is formed on the charge trap layer 33. Herein, the first protection layer 34 plays a role of preventing the charge trap layer 33 from being damaged during subsequent processes and acts as a buffer layer between the charge trap layer 33 and a hard mask layer to be formed. The first protection layer 34 may be formed of an oxide layer such as a silicon oxide ($SiO_2$) layer.

A first hard mask layer 35 is formed on the first protection layer 34. In this embodiment of the present invention, the first hard mask layer 35 is formed of a silicon layer. The silicon layer may include a polysilicon (poly-Si) layer or a silicon germanium (SiGe) layer.

A second hard mask layer 36 is formed on the first hard mask layer 35. The second hard mask layer 36 plays a role of providing an etch margin to a subsequent process of forming a trench for the device isolation and may be formed of an oxide layer. Herein, it is preferable to form the second hard mask layer 36 with a silicon oxide layer. For illustration purposes, since a silicon layer is a material having hardness smaller than that of a nitride layer, e.g., a silicon nitride layer, the etch margin for the subsequent process may be insufficient in case the hard mask layer is formed of only the silicon layer.

Figure 1B:
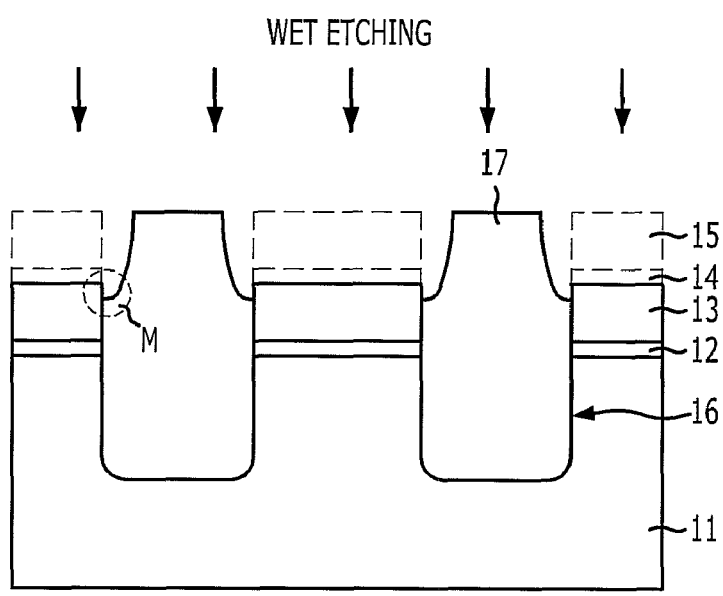
Figure 1C:
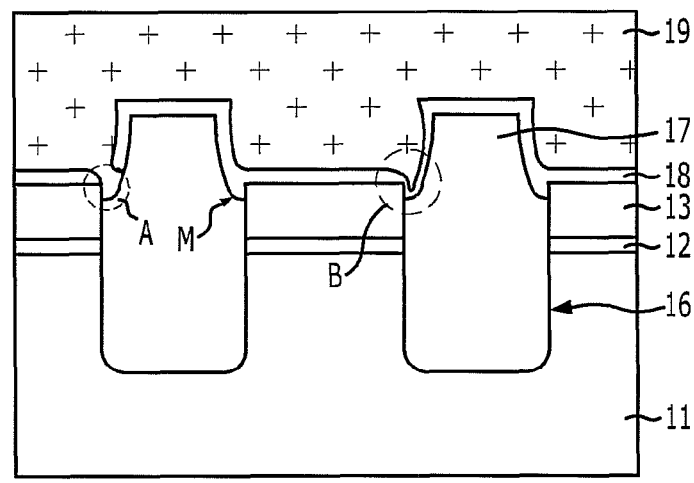

After forming a photoresist pattern (not shown) on the second hard mask layer 36, the second and first hard mask layers 36 and 35 are etched using the photoresist pattern as an etch barrier. As a result, a hard mask pattern 37 including etched first and second hard mask layers 35 and 36 is formed. For illustration purposes, although the hard mask pattern was formed of a single layer in the prior art as described with reference to FIGS. 1A to 1C, the hard mask pattern 37 in accordance with the present invention is formed of a stacked layer of the silicon layer, i.e., the first hard mask layer 35, and the silicon oxide layer, i.e., the second hard mask layer 36.

Figure 2B:
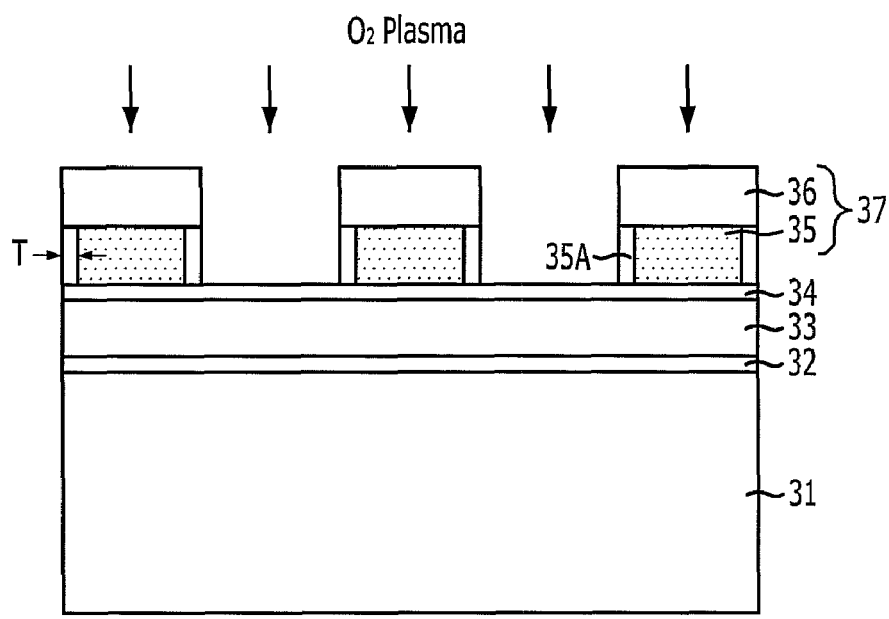

Referring to FIG. 2B, a second protection layer 35A is formed by transforming a portion of a sidewall of the first hard mask layer 35. The second protection layer 35A plays a role of preventing generation of a moat as the edge of an isolation layer is damaged during a subsequent process of removing the first hard mask layer 35 and a cleaning process, or a process of removing the first protection layer 34. Therefore, it is preferable to adjust the thickness of the second protection layer 35A by considering an amount of the isolation layer that is lost during the subsequent process of removing the first hard mask layer 35 and the cleaning process. Furthermore, it is preferable to form the second protection layer 35A having the thickness equal to or greater than the thickness of the first protection layer 34, thereby preventing the isolation layer from being lost during completely removing the first protection layer 34 in the subsequent cleaning process. For instance, the second protection layer 35A may be formed to have the thickness (T) in a range of approximately 40 Å to approximately 60 Å.

The second protection layer 35A and the first protection layer 34 may be formed of the same material. Accordingly, the second protection layer 35A may be formed of an oxide layer. This is for simplifying a sequence of processes by removing the first protection layer 34 and the second protection layer 35A at a time in the subsequent cleaning process. For illustration purposes, it is preferable to remove the second protection layer 35A to secure a contact area between a dielectric layer and the charge trap layer 33 before depositing the dielectric layer.

In addition, it is preferable to form the second protection layer 35A by transforming the portion of the sidewall of the first hard mask layer 35 to prevent a line width of the hard mask pattern 37 from being changed.

As an example, the second protection layer 35A may be formed by oxidizing the portion of the sidewall of the first hard mask layer 35 constructed of the silicon layer. Therefore, the second protection layer 35A may be formed of a silicon oxide ($SiO_2$) layer.

In particular, the second protection layer 35A may be formed using $O_2$ plasma at a low temperature of approximately 10° C. to approximately 400° C. At this time, the reason for performing the process of forming the second protection layer 35A at the low temperature of approximately 10° C. to approximately 400° C. is to comparatively easily adjust the thickness (T) of the second protection layer 35A while reducing thermal stress applied to the charge trap layer 33 during the processes. That is, in case of forming the second protection layer 35A at a temperature of less than 10° C., the second protection layer 35A may not be formed normally, or a speed of forming the second protection layer 35A may be decreased and thus the productivity thereof may suffer. On the other hand, in case of forming the second protection layer 35A at a temperature of higher than 400° C., the speed of forming the second protection layer 35A becomes comparatively fast. As a result, it may be difficult to form the second protection layer 35A having the thickness (T) in the range of approximately 40 Å to approximately 60 Å and the charge trap layer 33 may be deformed or damaged by the increase of the thermal stress applied thereto. Meanwhile, since the second protection layer 35A may be formed using the $O_2$ plasma, the second protection layer 35A may be formed by readily oxidizing the silicon layer even at the low temperature of approximately 10° C. to approximately 400° C.

Figure 2C:
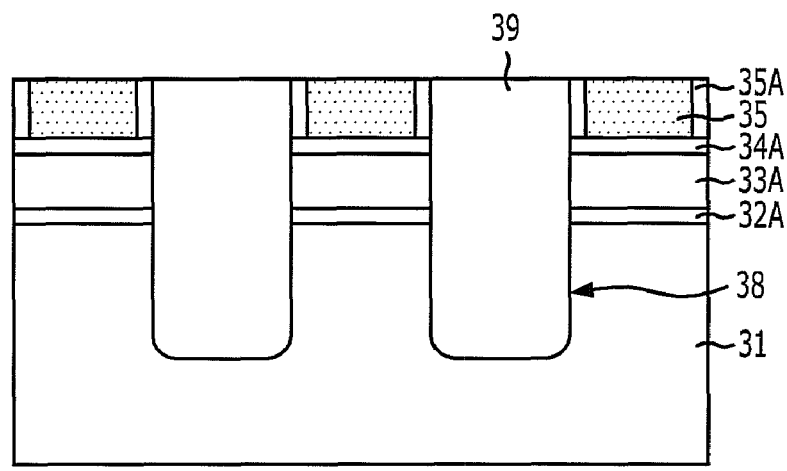

Referring to FIG. 2C, a trench 38 for the device isolation is formed by sequentially etching the first protection layer 34, the charge trap layer 33, the tunnel insulation layer 32 and the substrate 31 using the hard mask pattern 37 and the second protection layer 35A as an etch barrier. Herein, the etched first protection layer, the etched charge trap layer and the etched tunnel insulation layer are indicated by reference numerals 34A, 33A and 32A, respectively.

Then, after depositing an insulation material to fill the trench 38 and cover the hard mask pattern 37, the isolation layer 39 is formed by performing a planarization process on the deposited insulation material until the top surface of the first hard mask layer 35 is exposed. In this process, the second hard mask layer 36 is removed. The planarization process may be performed using a chemical-mechanical polishing (CMP) method.

The isolation layer 39 may be formed of the same material as those of the first and second protection layers 34 and 35A.

That is, the isolation layer 39 may be formed of an oxide layer. Herein, the isolation layer 39 may be formed using an oxide layer having a relatively superior filling characteristic, e.g., an SOD layer, to prevent the generation of defects such as seams in the layer.

Figure 2D:
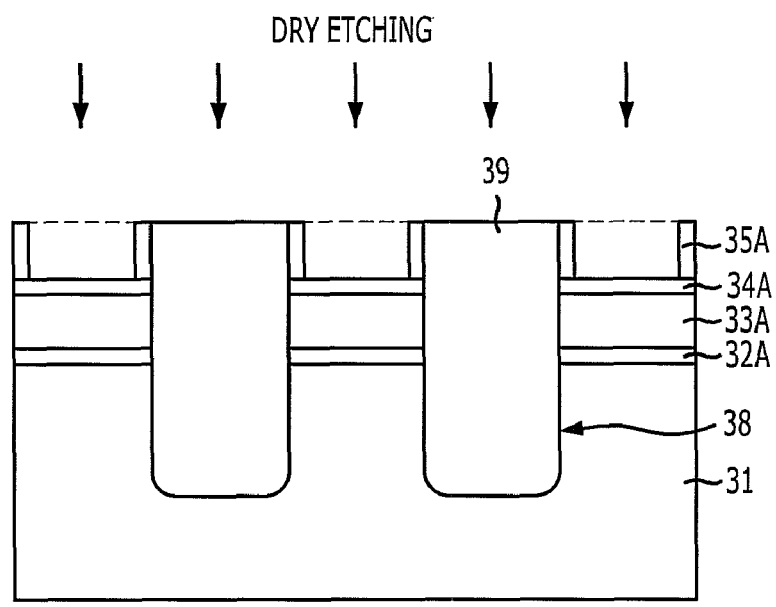

Referring to FIG. 2D, the first hard mask layer 35 is removed. At this time, the first hard mask layer 35 may be removed through a dry etch process and an etch gas thereof may use a gas having the selectivity to the isolation layer 39, the etched first protection layer 34A and the second protection layer 35A. That is, a gas for selectively etching the first hard mask layer 35 and not etching the isolation layer 39, the etched first protection layer 34A and the second protection layer 35A may be used as the etch gas. For instance, in case the first hard mask layer 35 includes the silicon layer, and the isolation layer 39 and the etched first and second protection layers 34A and 35A include the oxide layer, the etch gas may use a mixed gas ($HBr/Cl_2/SF_6$) of a hydrobromic (HBr) gas, a chloric ($Cl_2$) gas and a $SF_6$ gas.

For illustration purposes, in case the isolation layer 39 includes the oxide layer, e.g., the SOD layer, and the hard mask layers include the nitride layer, a wet etch process using a phosphoric acid solution is inevitably performed to remove only the hard mask layers. That is, it is practically impossible to selectively remove only the hard mask layers formed of the nitride layer through the dry etch process. This is because, in general, the oxide layer is also etched by a fluoric gas, e.g., a $CF_4$ gas, a $CHF_3$ gas and so on, used as a gas for etching the nitride layer.

However, in accordance with the embodiment of the present invention, since the first hard mask layer 35 is formed of the silicon layer, it is possible to selectively remove only the first hard mask layer 35 without the loss of the isolation layer 39, the etched first protection layer 34A and the second protection layer 35A through the dry etch process. Therefore, the present invention can prevent the edge of the isolation layer 39 from being lost during the process of removing the first hard mask layer 35. Furthermore, the loss of the isolation layer 39 can be more effectively prevented since the second protection layer 35A acts as a barrier in the process of removing the first hard mask layer 35. After all, the present invention prevents the edge of the isolation layer 39 from being lost during the process of removing the first hard mask layer 35 and thus it is possible to prevent the generation of a moat.

Figure 2E:
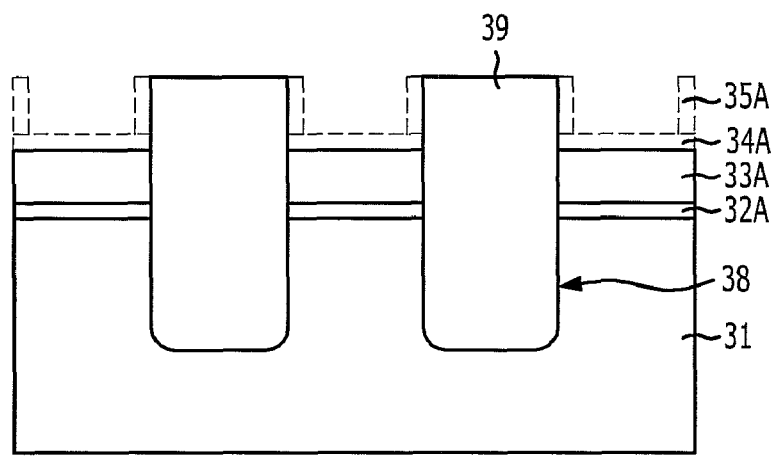

Referring to FIG. 2E, a cleaning process is performed to remove residue remaining on the substrate 31 and expose the top surface of the etched charge trap layer 33A. That is, the etched first protection layer 34A is removed through the cleaning process. At this time, although the second protection layer 35A formed of the same material as that of the first protection layer 34 is also etched, it is possible to prevent the isolation layer 39 from being lost by the partially etched second protection layer 35A during the cleaning process since the second protection layer 35A has the thickness equal to or greater than that of the first protection layer 34A. Thus, it is possible to prevent the generation of a moat during the cleaning process.

The cleaning process may include a wet etch process and use a solution containing a hydro fluoric acid (HF). Herein, the solution containing the hydro fluoric acid may include buffered oxide etchant or a diluted HF solution where deionized water and a hydro fluoric acid solution are mixed.

Figure 2F:
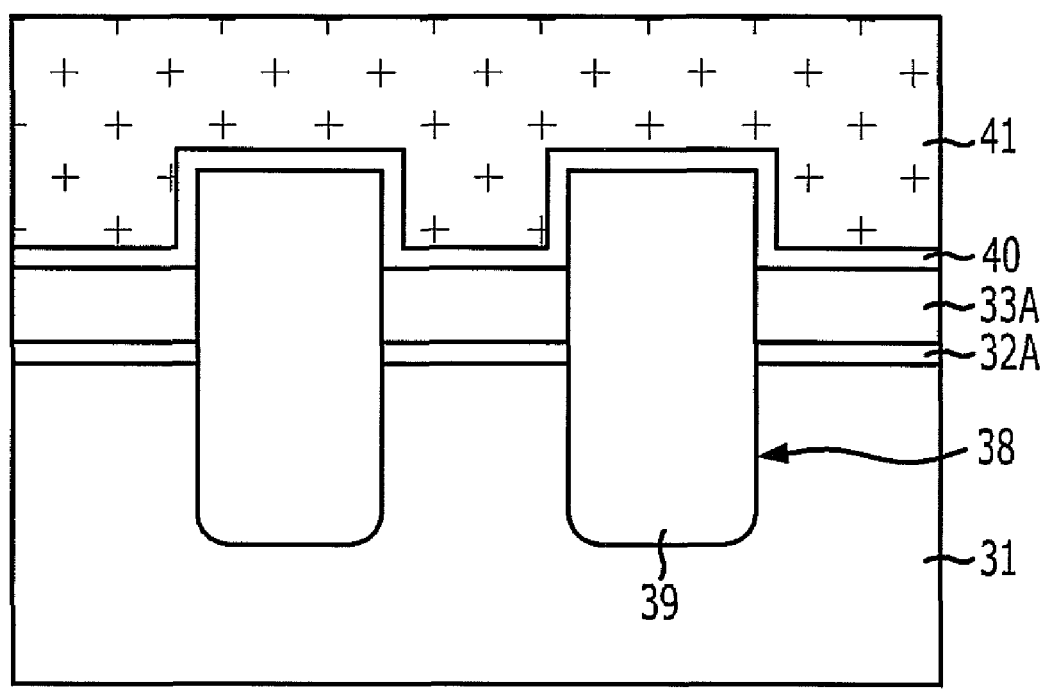

Referring to FIG. 2F, the dielectric layer 40 is formed along the entire surface of a resultant structure including the isolation layer 39. The dielectric layer 40 may be formed of a material having high permittivity (high-K). Herein, the material having the high-K means a material having a dielectric constant greater than that of a silicon oxide layer. Therefore, the high-K material has a dielectric constant higher than 3.9.

In particular, the dielectric layer 40 may be formed of a metal oxide layer having high permittivity. The metal oxide layer may include a single layer or a stacked layer selected from a group consisting of an aluminum oxide ($Al_2O_3$) layer, a hafnium oxide ($HfO_2$) layer, a zirconium oxide ($ZrO_2$) layer, an yttrium oxide ($Y_2O_3$) layer and a lanthanum oxide ($La_2O_3$) layer.

Herein, in accordance with the embodiment of the present invention, the dielectric layer 40 can be formed to have uniform thickness over the resultant structure by preventing the generation of the moat when forming the isolation layer 39. Through this, it is possible to form the unit memory devices of the charge trap type nonvolatile memory device to have uniform performance characteristics. That is, it is possible to enhance the performance characteristics of the nonvolatile memory device.

Then, a gate electrode 41 is formed on the dielectric layer 40. The gate electrode 41 may include one of a silicon layer and a metallic layer, or a stacked layer of the silicon layer and the metallic layer. The silicon layer may include a polysilicon layer or a silicon germanium (SiGe) layer. The metallic layer may include one selected from a group consisting of a tungsten (W) layer, a titanium (Ti) layer, a tantalum (Ta) layer, a tungsten nitride (WN) layer, a tantalum nitride (TaN) layer, a titanium nitride (TiN) layer and a tungsten silicide (WSi) layer.

The present invention can prevent generation of a moat during the process of forming the isolation layer 39 and thus prevent the variation of a coupling ratio of the charge trap layer 33A and the gate electrode 41 caused by an electrical short through an opening in the dielectric layer 40 in the area of the moat.

The charge trap type nonvolatile memory device in accordance with the present invention can be fabricated through the above processes.

In brief, in accordance with the embodiment of the present invention, since the first hard mask layer 35 includes the silicon layer and the first hard mask layer 35 is removed by performing the dry etch process, it is possible to prevent the isolation layer 39 from being lost when removing the first hard mask layer 35 and thus prevent the generation of the moat.

Moreover, in accordance with the embodiment of the present invention, since the second protection layer 35A is formed by transforming the portion of the sidewall of the first hard mask layer 35, the loss of the isolation layer 39 during the process of removing the first hard mask layer 35 can be prevented and thus the generation of the moat may be much more effectively prevented.

Further, since the present invention forms the second protection layer 35A, the loss of the isolation layer 39 during the cleaning process is prevented and thus the generation of the moat may be much more effectively prevented.

By preventing the generation of a moat during the process of forming the isolation layer 39, the present invention can prevent the performance characteristics of the nonvolatile memory device from being deteriorated by the moat.

While the present invention has been described with respect to the specific embodiments, it will be apparent to those skilled in the art that various changes and modifications may be made without departing from the spirit and scope of the invention as defined in the following claims.

What is claimed is:
1. A method for fabricating a semiconductor device, the method comprising:
forming a hard mask pattern over a substrate;
forming a protection layer by transforming a portion of a sidewall of the hard mask pattern;
forming a trench by etching the substrate using the hard mask pattern and the protection layer as an etch barrier;
forming an isolation layer by filling the trench with an insulation material; and
removing the hard mask pattern,
wherein the forming of the protection layer comprises oxidizing the portion of the sidewall of the hard mask pattern.

2. The method of claim 1, after the removing of the hard mask pattern, further comprising performing a cleaning process.

3. The method of claim 2, wherein the cleaning process is performed using a solution containing a hydro fluoric acid (HF).

4. The method of claim 1 wherein the forming of the protection layer is performed using $O_2$ plasma.

5. The method of claim 1 where the forming of the protection layer is performed at a temperature between approximately 10° C. and approximately 400° C.

6. The method of claim 1, wherein the removing of the hard mask pattern comprises performing a dry etch process.

7. The method of claim 1, wherein the isolation layer comprises a spin on dielectric (SOD) layer.

8. The method of claim 1, wherein the hard mask pattern comprises a stacked layer of a silicon layer and an oxide layer and the protection layer is formed by oxidizing the silicon layer.

9. The method of claim 1, wherein the protection layer and the isolation layer comprise an oxide layer and the hard mask pattern comprises a silicon layer.

10. The method of claim 1, wherein the removing of the hard mask pattern comprises performing a dry etch process using a mixed gas of a hydrobromic (HBr) gas, a chloric ($Cl_2$) gas and a $SF_6$ gas.

11. A method for fabricating a nonvolatile memory device, the method comprising:
sequentially forming a tunnel insulation layer, a charge trap layer, a first protection layer and a hard mask pattern over a substrate;
forming a second protection layer by transforming a portion of a sidewall of the hard mask pattern;
forming a trench by etching the first protection layer, the charge trap layer, the tunnel insulation layer and the substrate using the hard mask pattern and the second protection layer as an etch barrier;
forming an isolation layer by filling the trench with an insulation material;
removing the hard mask pattern; and
performing a cleaning process to expose the top surface of the charge trap layer.

12. The method of claim 11, further comprising:
forming a dielectric layer along the entire surface of a resultant structure including the isolation layer; and
forming a gate electrode over the dielectric layer.

13. The method of claim 11, wherein the forming of the second protection layer comprises oxidizing the portion of the sidewall of the hard mask pattern.

14. The method of claim 13, wherein the forming of the second protection layer is performed using $O_2$ plasma.

15. The method of claim 13, where the forming of the second protection layer is performed at a temperature between approximately 10° C. and approximately 400° C.

16. The method of claim 11, wherein the removing of the hard mask pattern comprises performing a dry etch process.

17. The method of claim 11, wherein the isolation layer comprises a spin on dielectric (SOD) layer.

18. The method of claim 11, wherein the hard mask pattern comprises a stacked layer of a silicon layer and an oxide layer and the second protection layer is formed by oxidizing the silicon layer.

19. The method of claim 11, wherein the first and second protection layers and the isolation layer comprise an oxide layer and the hard mask pattern comprises a silicon layer.

20. The method of claim 11, wherein the removing of the hard mask pattern comprises performing a dry etch process using a mixed gas of a HBr gas, a $Cl_2$ gas and a $SF_6$ gas.

21. The method of claim 11, wherein the cleaning process is performed using a solution containing a hydro fluoric acid (HF).

22. A method for fabricating a semiconductor device, the method comprising:

forming a first protection layer over a substrate;
forming a first hard mask layer over the substrate;
forming a second hard mask layer over the first hard mask layer, wherein the first and second hard mask layers form a hard mask pattern;
forming a second protection layer by oxidizing a sidewall of the first hard mask layer, wherein the second protection layer has a thickness greater than a thickness of the first protection layer; and
forming a trench by etching the substrate using the hard mask pattern and the second protection layer as an etch barrier.

23. The method of claim 22, further comprising:
forming an isolation layer by filling the trench with an insulation material; and
removing the hard mask pattern.

* * * * *